United States Patent
Yamaguchi et al.

(10) Patent No.: US 6,399,529 B1
(45) Date of Patent: Jun. 4, 2002

(54) ELECTRIC-FIELD-INDUCIBLE DEFORMABLE MATERIAL

(75) Inventors: Hirofumi Yamaguchi, Komaki; Toshikatsu Kashiwaya, Inazawa, both of (JP)

(73) Assignee: NGK Insulators, Ltd., Nagoya (JP)

( * ) Notice: Subject to any disclaimer, the term of this patent is extended or adjusted under 35 U.S.C. 154(b) by 34 days.

(21) Appl. No.: 09/589,918

(22) Filed: Jun. 7, 2000

(30) Foreign Application Priority Data

Jun. 14, 1999 (JP) ............................................. 11-167147
Oct. 8, 1999 (JP) ............................................. 11-287725

(51) Int. Cl.[7] ............................................. C04B 35/46
(52) U.S. Cl. ...................... 501/137; 501/138; 501/139; 252/62.9 R
(58) Field of Search ................................ 501/137, 138, 501/139; 252/62.9 R

(56) References Cited

U.S. PATENT DOCUMENTS

| | | | |
|---|---|---|---|
| 4,244,830 A | 1/1981 | Hennings et al. | 106/39.5 |
| 4,862,029 A | 8/1989 | Kasai et al. | 310/311 |
| 5,029,042 A | 7/1991 | Dean | 361/321 |

FOREIGN PATENT DOCUMENTS

| | | | |
|---|---|---|---|
| DE | 1671076 | | 7/1971 |
| DE | 2348707 | * | 4/1975 |
| JP | 11-60334 | | 3/1999 |

OTHER PUBLICATIONS

Derwnt abstract for DE 1,671,076.*

* cited by examiner

*Primary Examiner*—C. Melissa Koslow
(74) *Attorney, Agent, or Firm*—Burr & Brown

(57) ABSTRACT

An electric-field-inducible deformable porcelain material is provided, comprising a main component $BaTiO_3$, with 0.05 to 2 wt % of at least one selected from Mn, Cu and Co in terms of a metal added thereto. The crystal phase in the porcelain is a single perovskite phase, and the value of the transversal electric-field-inducible deformation is $300 \times 10^{-6}$ or more in the field strength of 2000 V/mm. It is presumed that the amount of the rotating 90° domain becomes greater, and the electric-field-induced deformation due to this is increased. Thus, a sufficient displacement amount as a piezoelectric material is obtained.

1 Claim, 1 Drawing Sheet

ELECTRIC-FIELD-INDUCIBLE DEFORMABLE MATERIAL

FIELD OF THE INVENTION

The present invention relates to an electric-field-inducible deformable material which can be fired into a porcelain. More particularly, it relates to an electric-field-inducible deformable material which is fired into a piezoelectric element for an actuator and a sensor which are integrated as an electromechanical transducer for positioning a precise machine tool, control of the optical path length of an optical apparatus, a valve for controlling the flow rate, an ultrasonic motor or an automobile brake apparatus.

The present invention further relates to an electric-field-inducible deformable material which is suitably used as a micro-sensor in an element for measuring the physical properties of liquid, and in an element for measuring very small masses, or in a micro-actuator.

BACKGROUND OF THE INVENTION

As a piezoelectric material utilized for an actuator, a filter and various sensors, there have hitherto been known Pb(Zr,Ti)$O_3$ (hereinafter referred to as PZT), BaTi$O_3$ and the like. Among them, a PZT system is mainly used since it has better overall piezoelectric properties. In this respect, the Pb contained in PZT system is stabilized and, therefore, does not originally pose a problem of decomposition and the like. However, in some cases, a material containing no Pb is desired depending upon the use. Further, when a Pb-containing compound such as PZT, PLZT and the like is fired at en elevated temperature, a slight amount of Pb is generally vaporized. Therefore, there is a problem that the properties are difficult to be stabilized due to the change in the composition at firing particularly in thin film or thick film uses. On the contrary, although BaTi$O_3$ dose not contain Pb and, therefore, is a candidate material for such the use, since it has inferior piezoelectric properties as compared with PZT system, it has been used as an actuator or a sensor in few cases. Accordingly, for example, JP-A 11-60334 discloses a piezoelectric porcelain composition in which BaTi$O_3$ is used as an actuator. In the composition, the piezoelectric properties are improved by adjusting the composition to enhance the piezoelectric constant.

However, in the aforementioned piezoelectric porcelain composition disclosed in JP-A 11-60334, even an electric-field-inducible deformable material in which the content of Cu is adjusted to 0.05 to 2.0 parts by weight in terms of CuO, relative to 100 parts by weight of a main component, by substituting a part of Ti of BaTi$O_3$ with Zr, can not afford the desired displacement amount for an actuator. In addition, in the resulting piezoelectric porcelain, a crystal phase in which a majority of Cu is dissolved in a perovskite crystal phase expressed as Ba$x$(Ti1-yZry)$O_3$ is formed, but even a composition having a peak piezoelectric constant can not afford sufficient displacement for a piezoelectric material.

SUMMARY OF THE INVENTION

Accordingly, the present inventors paid attention to the fact that only the electric-field-inducible deformation, and not the piezoelectric constant, contributes to the displacement properties of a piezoelectric material. It was found that the electric-field-inducible deformation is increased by including Mn, Cu and Co in BaTi$O_3$ and rendering a crystal phase in a porcelain into a single perovskite phase, which resulted in the completion of the present invention. That is, the present invention is an electric-field-inducible deformable material comprising as a main component BaTi$O_3$ with added 0.05 to 2 wt % of at least one selected from Mn, Cu and Co in terms of a metal, wherein a crystal phase in a porcelain is a single perovskite phase and the value of the transversal electric-field-inducible deformation is $300 \times 10^{-6}$ or more in the field strength of 2000 V/mm.

Thereby, an amount of a rotating 90° domain becomes larger and it is presumed that the electric-field-inducible deformation due to this is increased and, thus, the sufficient displacement amount is obtained as a piezoelectric material.

DETAILED DESCRIPTION OF THE INVENTION

Figure 1:
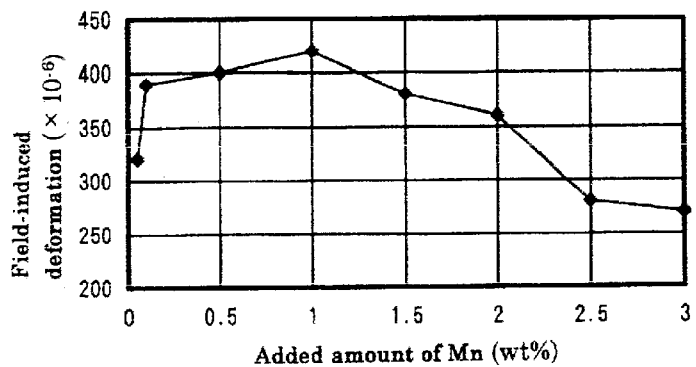
FIG. 1 is a graph of the relationship between the amount of Mn added and the electric-field-inducible deformation.

The mode for carrying out the electric-field-inducible material relating to the present invention will be explained below.

In the electric-field-inducible deformable material of the present invention, the electric-field-inducible deformation can be increased, irrespective of the lower piezoelectric constant, by including BaTi$O_3$ as a main component, adding 0.05 to 2 wt % of at least one selected from Mn, Cu and Co in terms of a metal, and rendering the crystal phase in a fired porcelain to be a single perovskite phase. It is presumed that this is attributable to the increase in the relative ratio of a 90° domain which rotates with the application of the electric field. In addition, when the content is smaller than 0.05%, the fired porcelain is not densified, while when the content is greater than 2%, the heterogenous phase is remarkably increased and, thus, the decrease in the electric-field-inducible deformation becomes remarkable. In order to obtain a higher electric-field-inducible deformation, preferably, the addition of an amount of 0.1 to 1 wt % is suitable.

In order to render a crystal phase to be a single perovskite phase, it is necessary to sufficiently perform the mixing before calcination to the primary particle size for each raw material of 1 μm or smaller, and at the same time, adjust a Ba/Ti ratio of BaTi$O_3$ depending on the kind and amount of additive. In addition, this Ba/Ti ratio is necessary to appropriately adjust so as to obtain a single phase depending upon the form of the additive used, for example, the state such as a salt and a metal, and the firing temperature and the like.

The crystal phase in a porcelain can be confirmed by X-ray diffraction. In addition, with BaTi$O_3$ as a main component, Ba may be substituted with Sr. In addition, in a porcelain of the present invention, an amount of 0.5 wt % or smaller of Zr, Si and the like may be irreversibly contained. The form of the Mn, Cu and Co may be usually an oxide, a carbonate or a sulfate.

In addition, since the electric-field-inducible deformable material relating to the present invention has excellent displacement properties, it is generally useful as an electromechanical transducer, and is suitably used as an actuator, a sensor and the like. For example, first, a diaphragm substrate having a thin part with a thickness of 3 to 50 μm, preferably 5 to 15 μm, is prepared using sintered zirconia or alumina, and preferably partially-stabilized zirconia. As this substrate, a substrate in which a thin diaphragm integrally laminated so as to cover a window part of a ceramic substrate is prepared so that it is convex outwardly in a direction opposite to the window part described in JP-A 8-51238. A substrate in which a flat part of a curve part having the predetermined curvature is formed at a convex top part of a diaphragm part or a part including the same are also suitable.

A heat-resistant metal film composed of Pt, Pt—Pd alloy having a thickness of 1 to 10 μm as a lower electrode is formed on the surface of the thin part of this substrate. The electric-field-inducible deformable material of the present invention is formed on this lower electrode by a thick film forming method, and fired at a temperature of 1000° C. to 1300° C. As a method for forming a thick film, a dipping method, a screen printing method, a spin coater method and the like can be used and, preferably, a screen printing method is used. The thickness of an electric-field-inducible deformable material after firing is preferably 1 to 40 μm, more preferably 5 to 25 μm. On the formed electric-field-inducible deformable material film, Pt, Au, Ag, Cu or the like, preferably Au or Ag, is formed as an upper electrode having a thickness of 2 μm or smaller.

The electric-field-inducible deformable material thus formed is suitably used in a micro-sensor used in an element for measuring the physical properties of liquid and an element for measuring a very small gravity, a highly integrated micro-actuator and the like disclosed in JP-A 8-201265.

In addition, since the electric-field-inducible deformable material of the present invention has a lower reactivity with other members when fired under the presence of other members, for example, by placing on other members, it can suppress the fusion-bonding to the aforementioned diaphragm substrate and the properties originally harbored by an electric-field-inducible material is not lowered. In addition, since it has a smaller influence on other members, it has no adverse effects, such as causing cracks on other members.

EXAMPLES $BaCO_3$, $TiO_2$, $MnO_2$, CuO, and CoO, were each weighed so that the composition in a porcelain contains Mn, Cu and Co, respectively and wet-mixed with 2 mmø zirconia balls for 60 hours. After drying, the mixture was calcined, then ground with a ball mill. The powders after grinding were formed into 20ø×15 t and fired at 1300° C. in the atmosphere.

The porcelain obtained by firing was processed into a sample having the dimensions of length 12×width 3×thickness 1 mm, and thereafter polarized in a thickness direction under the conditions of 65° C., 3 kV/mm and 10 minutes in a silicone oil. A strain gauge was adhered to the 12×3 plane of the polarized sample, and the induced deformation was measured when the electric field of 2 kV/mm was applied in a thickness direction. The produced phase in the porcelain was examined by the X-ray diffraction using Cu as a target. These results are shown in Tables 1 to 3 and the relationship between the added amount of each additive and the electric-field-inducible deformation was graphically shown in each Table.

TABLE 1

| Composition No. | Ba/Ti ratio | Additive | Added amount (wt %) | Produced phase | Transversal electric-field-induced deformation at 2 kV/mm |
|---|---|---|---|---|---|
| 1* | 1/0.9996 | Mn | 0.01 | Single phase | Not densified |
| 2 | 1/0.998 | | 0.05 | Single phase | 320 |
| 3 | 1/0.996 | | 0.1 | Single phase | 390 |
| 4 | 1/0.98 | | 0.5 | Single phase | 400 |
| 5 | 1/0.96 | | 1 | Single phase | 420 |
| 6 | 1/0.95 | | 1.5 | Single phase | 380 |
| 7 | 1/0.92 | | 2 | Single phase | 360 |
| 8* | 1/0.91 | | 2.5 | Heterogenous phase | 280 |
| 9* | 1/0.89 | | 3 | Heterogenous phase | 270 |
| 10* | 1/1 | | 1 | Heterogenous phase | 290 |
| 11* | 1/0.94 | | 1 | Heterogenous phase | 280 |

From Table 1, it is seen that when the added amount of Mn is smaller than 0.05 wt %, firing does not afford densification, while when the amount exceeds 2.5 wt % or greater, the electric-field-induced deformation becomes $300 \times 10^{-6}$ or smaller, generating the heterogenous phase. The asterisks represent comparative examples outside the scope of the present invention. The relationship between the amount of Mn added and the electric-field-inducible deformation is shown graphically in FIG. 1.

TABLE 2

| Composition No. | Ba/Ti ratio | Additive | Added amount (wt %) | Produced phase | Transversal electric-field-induced deformation at 2 kV/mm |
|---|---|---|---|---|---|
| 12* | 1/0.9996 | Cu | 0.01 | Single phase | Not densified |
| 13 | 1/0.998 | | 0.05 | Single phase | 300 |
| 14 | 1/0.996 | | 0.1 | Single phase | 370 |
| 15 | 1/0.98 | | 0.5 | Single phase | 380 |
| 16 | 1/0.96 | | 1 | Single phase | 390 |
| 17 | 1/0.95 | | 1.5 | Single phase | 370 |
| 18 | 1/0.92 | | 2 | Single phase | 310 |
| 19* | 1/0.91 | | 2.5 | Heterogenous phase | 230 |
| 20* | 1/0.89 | | 3 | Heterogenous phase | 220 |
| 21* | 1/1 | | 1 | Heterogenous phase | 250 |
| 22* | 1/0.94 | | 1 | Heterogenous phase | 230 |

Figure 2:
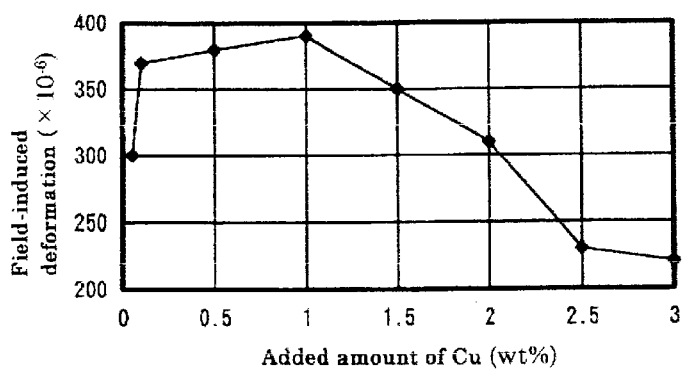
FIG. 2 is a graph of the relationship between the amount of Cu added and the electric-field-inducible deformation.

From Table 2, it is seen that when the added amount of Cu is smaller than 0.05 wt %, firing does not afford densification, while when the amount exceeds 2.0 wt %, the electric-field-induced deformation becomes $300 \times 10^{-6}$ or smaller, generating the heterogenous phase. The asterisks represent comparative examples outside the scope of the present invention. The relationship between the amount of Cu added and the electric-field-inducible deformation is shown graphically in FIG. 2.

TABLE 3

| Composition No. | Ba/Ti ratio | Additive | Added amount (wt %) | Produced phase | Transversal electric-field-induced deformation at 2 kV/mm |
|---|---|---|---|---|---|
| 23* | 1/0.9996 | Co | 0.01 | Single phase | Not densified |
| 24 | 1/0.998 |  | 0.05 | Single phase | 350 |
| 25 | 1/0.996 |  | 0.1 | Single phase | 400 |
| 26 | 1/0.98 |  | 0.5 | Single phase | 410 |
| 27 | 1/0.96 |  | 1 | Single phase | 390 |
| 28 | 1/0.95 |  | 1.5 | Single phase | 370 |
| 29 | 1/0.92 |  | 2 | Single phase | 350 |
| 30* | 1/0.91 |  | 2.5 | Heterogenous phase | 280 |
| 31* | 1/0.89 |  | 3 | Heterogenous phase | 290 |
| 32* | 1/1 |  | 1 | Heterogenous phase | 280 |
| 33* | 1/0.94 |  | 1 | Heterogenous phase | 270 |

Figure 3:
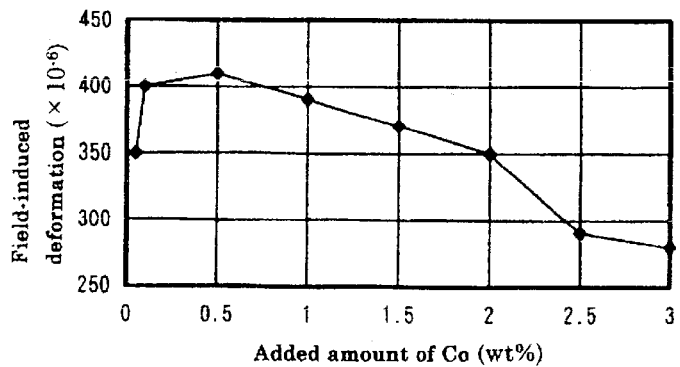
FIG. 3 is a graph of the relationship between the amount of Co added and the electric-field-inducible deformation.

From Table 3, it is seen that when the added amount of Co is smaller than 0.05 wt %, firing does not afford densification, while when the amount exceeds 2.0 wt %, the electric-field-induced deformation becomes $300 \times 10^{-6}$ or smaller, generating the heterogenous phase. The asterisks represent comparative examples outside the scope of the present invention. The relationship between the amount of Co added and the electric-field-inducible deformation is shown graphically in FIG. 3.

As explained above, according to the present invention, it is presumed that, by including Mn, Cu and Co and rendering a crystal phase in a porcelain to be a single perovskite in $BaTiO_3$, the amount of the rotating 90° domain becomes greater and the electric-field-induced deformation due to this is increased. Thus, a sufficient displacement amount as a piezoelectric material is obtained. And, the present invention can be utilized as an actuator and a sensor used when a material containing no Pb is required. In particular, the present invention is suitably used as a micro-sensor in an element for measuring the physical properties of liquid, in an element for measuring very small masses, and in a highly integrated micro-actuator for highly integrated ink jet printing-headers.

What is claimed is:

1. An electric-field-inducible deformable material having a transversal electric-field-inducible deformation value of $300 \times 10^{-6}$ or more in a field strength of 2000 V/mm, said material comprising a porcelain having a main component of $BaTiO_3$ and 0.05 to 2 wt % of at least one metal selected from the group consisting of Mn, Cu and Co, wherein the Ba/Ti ratio is in a range of 1/0.92 to 1/0.998, and said porcelain comprises only one crystal phase of perovskite structure.

* * * * *

UNITED STATES PATENT AND TRADEMARK OFFICE
CERTIFICATE OF CORRECTION

PATENT NO. : 6,399,529 B1  Page 1 of 1
DATED : June 4, 2002
INVENTOR(S) : Hirofumi Yamaguchi and Toshikatsu Kashiwaya It is certified that error appears in the above-identified patent and that said Letters Patent is hereby corrected as shown below:

<u>Title page,</u>
Item [30], Foreign Application Priority Data
"Jun. 14, 1999    (JP) ........................ 11-167147
Oct. 8, 1999      (JP) ........................ 11-287725"

should read as follows:

-- Jun. 14, 1999   (JP) ……………….. 11-167417
Oct. 8, 1999      (JP) ……………….. 11-287725 --

Signed and Sealed this

First Day of October, 2002

Attest:

Attesting Officer

JAMES E. ROGAN
*Director of the United States Patent and Trademark Office*